United States Patent
Dede et al.

(10) Patent No.: US 10,231,364 B2
(45) Date of Patent: Mar. 12, 2019

(54) FLUIDLY COOLED POWER ELECTRONICS ASSEMBLIES HAVING A THERMO-ELECTRIC GENERATOR

(71) Applicant: Toyota Motor Engineering & Manufacturing North America, Inc., Erlanger, KY (US)

(72) Inventors: Ercan Mehmet Dede, Ann Arbor, MI (US); Shailesh N. Joshi, Ann Arbor, MI (US); Chi-Ming Wang, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 15/332,537

(22) Filed: Oct. 24, 2016

(65) Prior Publication Data
US 2018/0116076 A1   Apr. 26, 2018

(51) Int. Cl.
*H05K 7/20* (2006.01)
*H01L 35/00* (2006.01)

(52) U.S. Cl.
CPC ......... *H05K 7/20945* (2013.01); *H01L 35/00* (2013.01); *H05K 7/209* (2013.01); *H05K 7/20272* (2013.01); *H05K 7/20927* (2013.01)

(58) Field of Classification Search
CPC ........... H05K 7/20945; H05K 7/20927; H05K 7/209; H01L 35/00
USPC ....................................................... 361/677
See application file for complete search history.

(56) References Cited

U.S. PATENT DOCUMENTS

| | | | |
|---|---|---|---|
| 5,291,087 A | 3/1994 | Pollick et al. | |
| 5,398,519 A * | 3/1995 | Weber | H05K 7/20381 165/41 |
| 6,708,501 B1 | 3/2004 | Ghoshal et al. | |
| 7,002,801 B2 | 2/2006 | Zeighami et al. | |
| 7,139,172 B2 | 11/2006 | Bezama et al. | |
| 7,278,474 B2 | 10/2007 | Valenzuela et al. | |

(Continued)

FOREIGN PATENT DOCUMENTS

| | | |
|---|---|---|
| CN | 101916757 | 12/2011 |
| WO | WO2015086184 | 6/2015 |

OTHER PUBLICATIONS http://www.sciencedirect.com/science/article/pii/S0924424799003027, vol. 80 Issue 1, Mar. 2000 pp. 84-89, Jasesung Jang, Seung S. Lee.*

(Continued)

*Primary Examiner* — Mandeep S Buttar
(74) *Attorney, Agent, or Firm* — Dinsmore & Shohl LLP

(57) ABSTRACT

A power electronics assembly that includes a first cooling chip fluidly coupled to a second cooling chip. The first cooling chip and the second cooling chip each include a cooling chip fluid inlet, a cooling chip fluid outlet, and one or more cooling chip fluid channels extending between and fluidly coupled to the cooling chip fluid inlet and the cooling chip fluid outlet. The power electronics assembly also includes a semiconductor device positioned between and thermally coupled to the first cooling chip and the second cooling chip and a thermo-electric generator positioned between and thermally coupled to the semiconductor device and one of the first cooling chip or the second cooling chip.

20 Claims, 7 Drawing Sheets

(56) References Cited

U.S. PATENT DOCUMENTS

| | | | |
|---|---|---|---|
| 7,324,341 B2* | 1/2008 | Oman | H01L 23/427 |
| | | | 165/104.26 |
| 7,516,776 B2 | 4/2009 | Bezama et al. | |
| 7,592,697 B2 | 9/2009 | Arana et al. | |
| 7,781,263 B2 | 8/2010 | Winter et al. | |
| 7,916,480 B2 | 3/2011 | Woody et al. | |
| 7,952,875 B2 | 5/2011 | Woody et al. | |
| 8,012,808 B2 | 9/2011 | Shi et al. | |
| 8,030,754 B2 | 10/2011 | Hartwell et al. | |
| 8,049,329 B2 | 11/2011 | Baek et al. | |
| 8,198,174 B2 | 6/2012 | Hsu et al. | |
| 8,221,089 B2 | 7/2012 | Lower et al. | |
| 8,232,637 B2 | 7/2012 | Beaupre et al. | |
| 8,358,000 B2 | 1/2013 | Beaupre et al. | |
| 8,522,570 B2 | 9/2013 | Ouyang et al. | |
| 8,546,930 B2 | 10/2013 | Bakir et al. | |
| 8,552,283 B2 | 10/2013 | Dede et al. | |
| 8,659,896 B2 | 2/2014 | Dede et al. | |
| 8,829,670 B1 | 9/2014 | Zhang et al. | |
| 8,921,992 B2 | 12/2014 | Koontz et al. | |
| 8,929,071 B2 | 1/2015 | Beaupre et al. | |
| 9,041,193 B2 | 5/2015 | Bouras | |
| 9,220,184 B2 | 12/2015 | Ranjan et al. | |
| 9,312,202 B2 | 4/2016 | Bouras | |
| 9,313,921 B2 | 4/2016 | Brunschwiler et al. | |
| 9,355,933 B2 | 5/2016 | Ching et al. | |
| 9,717,161 B2* | 7/2017 | Katsumata | H05K 7/20254 |
| 2007/0230127 A1* | 10/2007 | Peugh | H01L 23/053 |
| | | | 361/699 |
| 2008/0001646 A1* | 1/2008 | Lui | H01L 27/0255 |
| | | | 327/427 |
| 2008/0205008 A1* | 8/2008 | Sun | H01L 25/16 |
| | | | 361/736 |
| 2008/0229759 A1 | 9/2008 | Ouyang et al. | |
| 2009/0308081 A1* | 12/2009 | Ouyang | H01L 23/38 |
| | | | 62/3.2 |
| 2012/0064656 A1* | 3/2012 | Fan | H01L 35/34 |
| | | | 438/54 |
| 2012/0140416 A1* | 6/2012 | Price | F28D 9/0093 |
| | | | 361/701 |
| 2012/0228779 A1* | 9/2012 | King, Jr. | H01L 23/473 |
| | | | 257/774 |
| 2013/0061605 A1 | 3/2013 | de Rochemont | |
| 2013/0135782 A1* | 5/2013 | Roth | G01K 7/16 |
| | | | 361/103 |
| 2014/0190543 A1 | 7/2014 | Chen | |
| 2014/0190665 A1 | 7/2014 | Joshi et al. | |
| 2014/0216058 A1* | 8/2014 | Tsuboi | G06F 1/20 |
| | | | 62/3.2 |
| 2014/0290916 A1 | 10/2014 | Arik et al. | |
| 2015/0221613 A1 | 8/2015 | Andry et al. | |
| 2016/0064308 A1* | 3/2016 | Yamada | H01L 23/142 |
| | | | 257/697 |
| 2016/0183407 A1* | 6/2016 | Katsumata | H05K 7/20254 |
| | | | 361/699 |
| 2017/0226994 A1* | 8/2017 | Richter | F04B 43/046 |

OTHER PUBLICATIONS

Kiflemariam, R., et al., "Numerical simulation of integrated liquid cooling and thermoelectric generation for self-cooling of electronic devices." (http://dx.doi.org/10.1016/j.ijthermalsci.2015.02.012 (2015).

Yazawa, K., et al., "Thermoelectric-Powered Convective cooling of microprocessors." (http://dx.doi.org/10.1109/TADVP.2005. 846854) (2005).

Singhal, V., et al., "Microscale pumping technologies for microchannel cooling systems." (http://dx.doi.org/10.1115/1.1695401)(2004).

Micropelt (http://micropelt.com/thermogenerator.php) (undated).

Valle-Mayorga, J., et al., "High-Temperature Silicon-on-Insulator Gate Driver for SiC-FET Power Modules." (http://dx.doi.org/10. 1109/TPEL.2011.2182213). (2012).

* cited by examiner

FLUIDLY COOLED POWER ELECTRONICS ASSEMBLIES HAVING A THERMO-ELECTRIC GENERATOR

TECHNICAL FIELD

The present specification generally relates to power electronics assemblies, and more particularly, to fluidly cooled power electronics assemblies having semiconductor devices, cooling chips, and thermo-electric generators.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Accordingly, a need exists for alternative power electronics assemblies and power electronics devices having internal cooling structures.

SUMMARY

In one embodiment, a power electronics assembly includes a first cooling chip fluidly coupled to a second cooling chip. The first cooling chip and the second cooling chip each include a cooling chip fluid inlet, a cooling chip fluid outlet, and one or more cooling chip fluid channels extending between and fluidly coupled to the cooling chip fluid inlet and the cooling chip fluid outlet. The power electronics assembly also includes a semiconductor device positioned between and thermally coupled to the first cooling chip and the second cooling chip and a thermo-electric generator positioned between and thermally coupled to the semiconductor device and one of the first cooling chip or the second cooling chip.

In another embodiment, a power electronics assembly includes a first cooling chip fluidly coupled to a second cooling chip. The first cooling chip and the second cooling chip each include a cooling chip fluid inlet, a cooling chip fluid outlet, and one or more cooling chip fluid channels extending between and fluidly coupled to the cooling chip fluid inlet and the cooling chip fluid outlet. The power electronics assembly further includes a micropump layer fluidly coupled to the first cooling chip, a semiconductor device positioned between and thermally coupled to the first cooling chip and the second cooling chip, and a thermo-electric generator positioned between and thermally coupled to the semiconductor device and one of the first cooling chip or the second cooling chip. Further, the thermo-electric generator is electrically coupled to the micropump layer such that energy generated by the thermo-electric generator provides power to the micropump layer.

In yet another embodiment, a method of cooling a semiconductor device of a power electronics assembly includes generating heat using a semiconductor device positioned between and thermally coupled to a first cooling chip and a second cooling chip. The first cooling chip and the second cooling chip each include a cooling chip fluid inlet, a cooling chip fluid outlet, and one or more cooling chip fluid channels extending between and fluidly coupled to the cooling chip fluid inlet and the cooling chip fluid outlet. The method also includes pumping cooling fluid through the first cooling chip and the second cooling chip using a micropump layer fluidly coupled to the first cooling chip thereby removing heat from the semiconductor device and forming a temperature gradient between a first substrate surface and a second substrate surface of a thermo-electric generator positioned between and thermally coupled to the semiconductor device and one of the first cooling chip or the second cooling chip. Further, the micropump layer is electrically coupled to the thermo-electric generator. Moreover, the method includes adjusting a pumping power of the micropump layer based on a signal output by the thermo-electric generator, where the signal corresponds with the temperature gradient between the first substrate surface and the second substrate surface of the thermo-electric generator.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to power electronics assemblies comprising a heat generating semiconductor device and a thermo-electric generator positioned in a stacked arrangement with one or more cooling chips, for example, between two fluidly coupled cooling chips that each include a cooling chip fluid inlet, a cooling chip fluid outlet, and one or more cooling chip fluid channels extending between and fluidly coupled to the cooling chip fluid inlet and the cooling chip fluid outlet. In operation, cooling fluid may be pumped through the cooling chips, for example, using a micropump layer fluidly coupled to the cooling chips, such that the two or more cooling chips may provide two-sided fluid cooling for the heat generating semiconductor device positioned therebetween. Further, the thermo-electric generator may generate energy from a temperature gradient formed between a first substrate surface and a second substrate surface of the thermo-electric generator while the two or more cooling chips fluidly cool the heat generating semiconductor device and may provide this generated energy to the micropump layer to power the micropump layer. Further, the micropump layer and the cooling chips reduce the size of the power electronics assembly because they are integrated into a single chip stack with the semiconductor device. Moreover, the thermo-electric generator increases the efficiency of the power electronics system by generating energy and providing generated energy to the micropump layer. Thus, the power electronics assembly of the present disclosure is a compact power electronics assembly that may efficiently cool high temperature heat generating semiconductor devices without using bulk cooling packaging.

Figure 1:
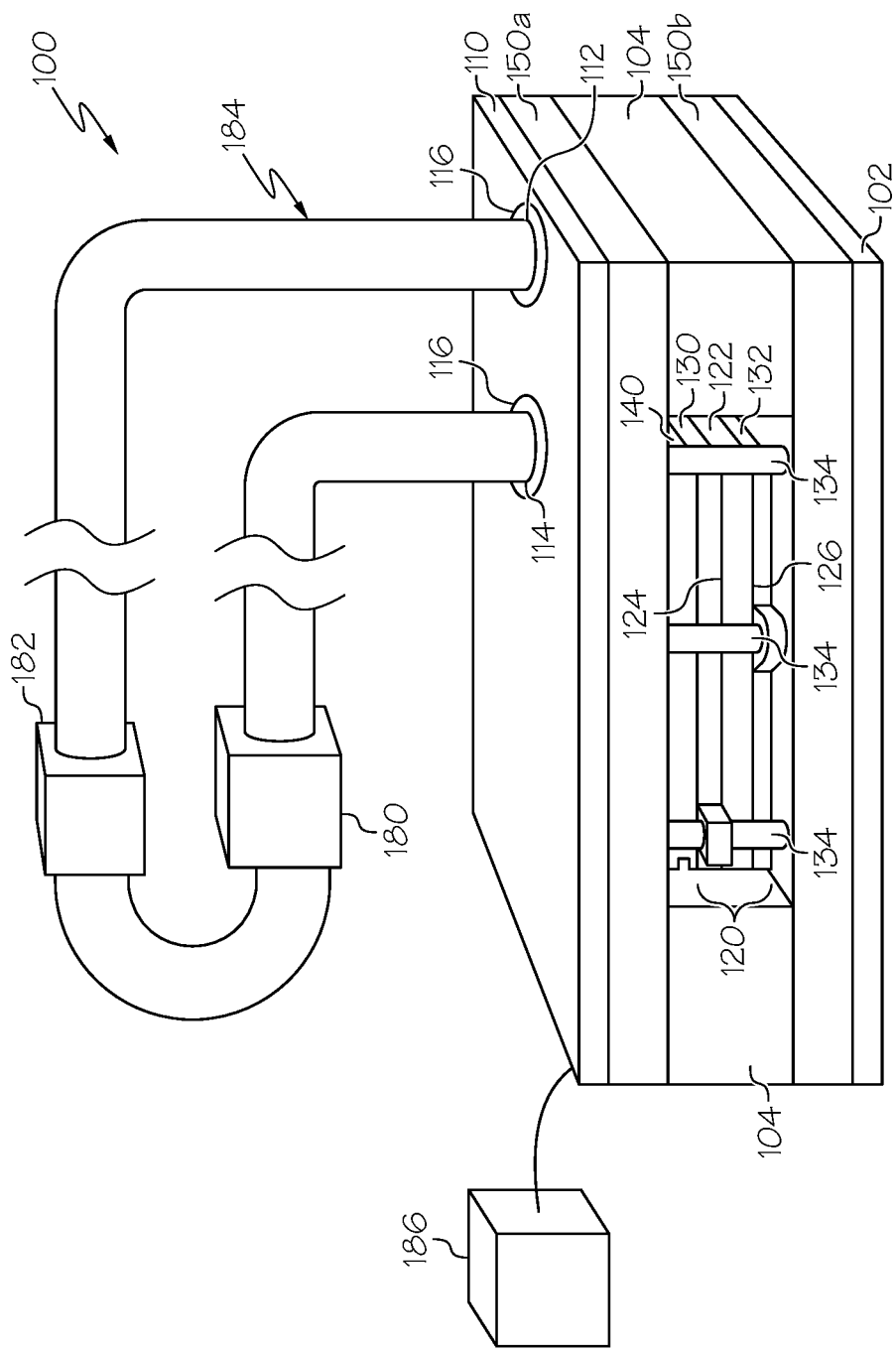
FIG. 1 schematically depicts an isometric view of an power electronics assembly having a semiconductor device, a thermo-electric generator, and two cooling chips, according to one or more embodiments shown and described herein.
Figure 2:
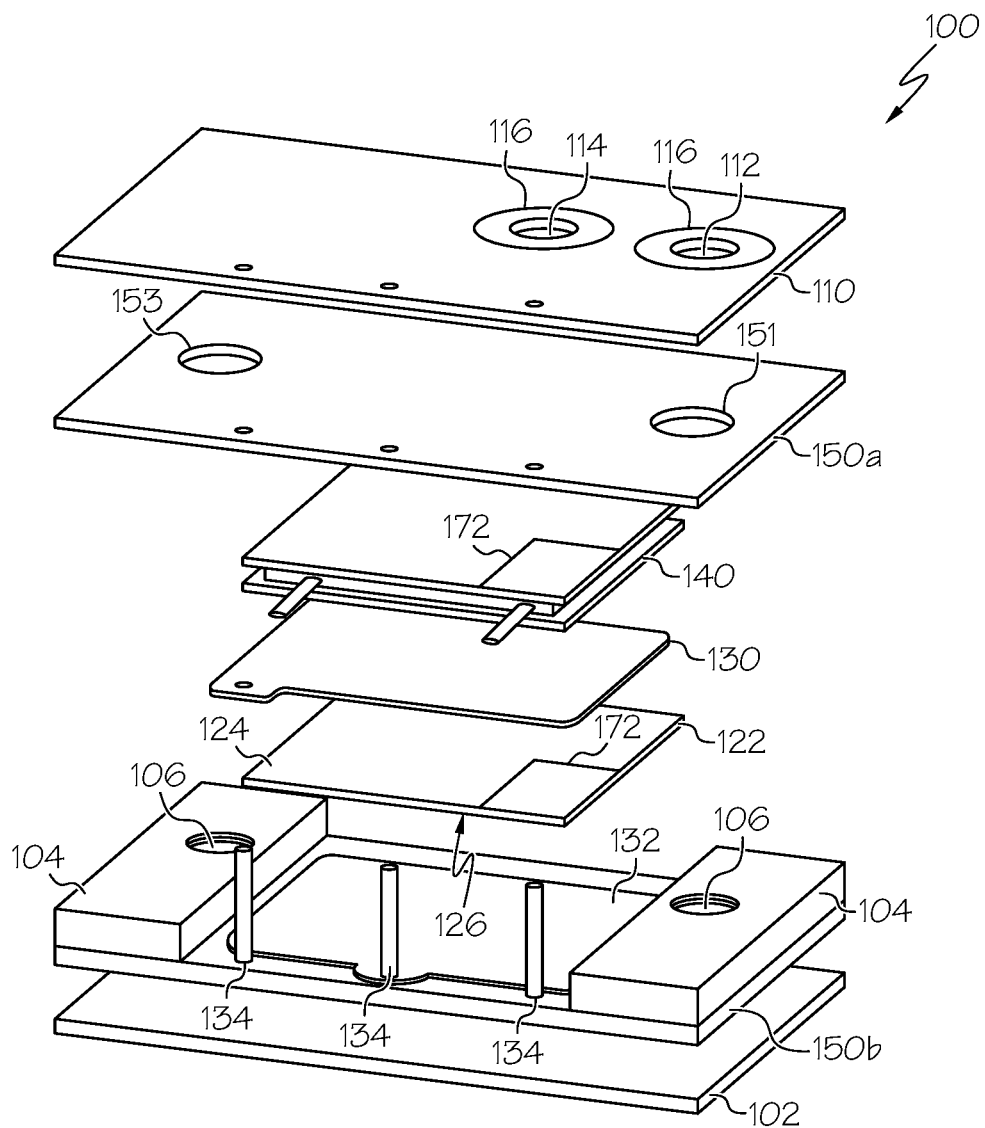
FIG. 2 schematically depicts an exploded view of the power electronics assembly of FIG. 1, according to one or more embodiments shown and described herein.

Referring to FIGS. 1 and 2, a power electronics assembly 100 comprising one or more cooling chips 150, a semiconductor device 122, a thermo-electric generator (TEG) 140, and a micropump layer 110 is depicted. FIG. 1 depicts an isometric view of the power electronics assembly 100 and FIG. 2 depicts an exploded view of the power electronics assembly 100. The one or more cooling chips 150 include at least a first cooling chip 150a and a second cooling chip 150b and the micropump layer 110 is coupled (e.g., bonded) to the first cooling chip 150a or the second cooling chip 150b. It should be understood that while two cooling chips 150a, 150b are depicted, the power electronics assembly 100 may comprise any number of cooling chips 150. The semiconductor device 122 and the TEG 140 are each positioned between the first cooling chip 150a and the second cooling chip 150b. Further, the first cooling chip 150a and the second cooling chip 150b may be fluidly coupled to micropump layer 110 such that the micropump layer 110 may pump cooling fluid through the first cooling chip 150a and the second cooling chip 150b to remove heat from the semiconductor device 122 positioned therebetween. Moreover, in operation, the TEG 140 may generate power based on a temperature gradient formed when heat is removed from the semiconductor device 122.

The semiconductor device 122 comprises a semiconductor material, for example, a Si semiconductor material or a wide bandgap semiconductor material, such as, without limitation SiC, GaN, AlN BN, diamond, or the like. As a non-limiting example, the wide bandgap semiconductor material may be any semiconductor material comprising a bandgap of about 3 eV or more. In some embodiments, the semiconductor device 122 may comprise an insulated-gate bi-polar transistor ("IGBT"), a metal-oxide-semiconductor field-effect transistor ("MOSFET") or any other semiconductor device. Further, as a non-limiting example, the semiconductor device 122 may operate at temperatures between about 250° C. and about 350° C. It should be understood that other operation temperatures are possible.

As depicted in FIGS. 1 and 2, the semiconductor device 122 comprises a first device surface 124 opposite a second device surface 126. The semiconductor device 122 may be arranged in a semiconductor device stack 120 that includes the semiconductor device 122, a first electrode 130 and a second electrode 132, and the semiconductor device 122 may operate as a vertical current device. The first device surface 124 faces the first electrode 130, for example, in contact with and/or coupled to the first electrode 130. The second device surface 126 faces the second electrode 132, for example, in contact with and/or coupled to the second electrode 132, such that the second electrode 132 is positioned opposite the first electrode 130. The first electrode 130 may comprise a discrete metal layer that is bonded to the first device surface 124 and/or may comprise a metallization layer that is deposited onto the first device surface 124 using any known or yet to be developed deposition methods. The second electrode 132 may comprise a discrete metal layer that is bonded to the second device surface 126 and/or may comprise a metallization layer that is deposited onto the second device surface 126 using any known or yet to be developed deposition methods.

The first electrode 130 and the second electrode 132 are each thermally coupled to the semiconductor device 122. Further, the first electrode 130 and the second electrode 132 are each electrically coupled to the semiconductor device 122 such that an electrical current pathway is formed between the first electrode 130 and the second electrode 132, extending through the semiconductor device 122, for example, a vertical electrical current pathway. In some embodiments, the first electrode 130 comprises a drain electrode and the second electrode 132 comprises a source electrode such that a vertical current pathway extends through the semiconductor device 122 from the source electrode to the drain electrode and, in operation, electrical current flows from the second electrode 132 to the first electrode 130. In other embodiments, the first electrode 130 comprises a source electrode and the second electrode 132 comprises a drain electrode such that, in operation, electrical current flows from the first electrode 130 to the second electrode 132. The first and second electrodes 130, 132 may comprise any electrically conductive material such as, without limitation, copper, copper oxide, graphite, brass, silver, platinum, or the like. Moreover, in some embodiments, one of the first and second electrodes 130, 132 may comprise a direct current (DC) electrode, for example a DC+ electrode or a DC− electrode, and the other of the first and second electrodes 130, 132 may comprise an alternating current (AC) electrode.

Referring still to FIGS. 1 and 2, the one or more cooling chips 150 may be thermally coupled to the semiconductor device 122 and in operation, may remove heat from the semiconductor device 122. For example, as depicted in FIGS. 1 and 2, the semiconductor device 122, the first electrode 130, and the second electrode 132 (e.g., the semiconductor device stack 120) may be positioned between the first cooling chip 150*a* and the second cooling chip 150*b* such that the first cooling chip 150*a* and the second cooling chip 150*b* may collectively provide two-sided cooling to the semiconductor device 122 and the semiconductor device stack 120. The one or more cooling chips 150 may comprise a semiconductor material, such as, without limitation Si, GaAs, SiC, GaN, AlN, BN, diamond, or the like. As a non-limiting example, the semiconductor material may be a wide bandgap semiconductor material, for example, any semiconductor material comprising a bandgap of about 3 eV or more. Example wide bandgap semiconductor materials include SiC, GaN, AlN, BN, and diamond. In one non-limiting example, the cooling chip 150, and the semiconductor device 122 may comprise the same semiconductor material.

Referring now to FIGS. 1-4B, each cooling chip 150 comprises a first outer chip surface 152, a second outer chip surface 154, which may be opposite the first outer chip surface 152, a cooling chip fluid inlet 151, a cooling chip fluid outlet 153, and one or more cooling chip fluid channels 155 extending between and fluidly coupled to the to the cooling chip fluid inlet 151 and the cooling chip fluid outlet 153. In operation, the cooling chip fluid inlet 151, the cooling chip fluid outlet 153, and the one or more cooling chip fluid channels 155 of each cooling chip 150 collectively form a fluid flowpath such that a cooling fluid may be circulated through the one or more cooling chips 150 to remove heat from the semiconductor device 122. The cooling fluid may be any appropriate liquid, such as deionized water or radiator fluid. Other exemplary fluids include, for example and without limitation, water, organic solvents, and inorganic solvents. Examples of such solvents may include commercial refrigerants such as R-134a, R717, and R744. Moreover, in some embodiments, the cooling fluid may be a dielectric cooling fluid. Non-limiting dielectric cooling fluids include R-245fa and HFE-7100. Other dielectric cooling fluids may be utilized. The type of cooling fluid chosen may depend on the operating temperature of the heat generating devices to be cooled. Further, selection of the composition of the cooling fluid used in association with the power electronics assembly 100 may be selected based on, among other properties, the boiling point, the density, and the viscosity of the cooling fluid.

Referring still to FIGS. 1-4B, the cooling chip fluid inlet 151 and the cooling chip fluid outlet 153 may each extend between the first outer chip surface 152 and the second outer chip surface 154 at discrete locations of the cooling chips 150. In some embodiments, the cooling chip fluid inlets 151 of the first cooling chip 150*a* and the second cooling chip 150*b* are each in fluid communication with one another, for example, the cooling chip fluid inlets 151 may be in concentric alignment. Further, in some embodiments, the cooling chip fluid outlets 153 of the first cooling chip 150*a* and the second cooling chip 150*b* are each in fluid communication with one another, for example, the cooling chip fluid outlets 153 may be in concentric alignment.

In some embodiments, as depicted in FIGS. 1 and 2, one or more chip connector portions 104 are positioned between and coupled to the first cooling chip 150*a* and the second cooling chip 150*b* for example, mechanically coupled to the first cooling chip 150*a* and the second cooling chip 150*b* using one or more fasteners or bonded to the first cooling chip 150*a* and the second cooling chip 150*b* using soldering, sintering, brazing, transient liquid phase bonding (TLP), anodic bonding, or any 150*b* other known or yet-to be developed bonding method. The chip connector portions 104 may comprise Si, glass, ceramic, or the like. Each chip connector portion 104 comprises a chip connector fluid throughput 106 extending through the chip connector portion 104 which may be fluidly aligned with the cooling chip fluid inlets 151 and/or cooling chip fluid outlets 153 of the first cooling chip 150*a* and the second cooling chip 150*b*. Moreover, the chip connector portions 104 may be coupled (e.g., bonded) to the first outer chip surface 152 and/or the second outer chip surface 154 of the first cooling chip 150*a* and/or the second cooling chip 150*b*, such that a gap is formed between the first cooling chip 150*a* and the second cooling chip 150*b* to provide a location for the semiconductor device stack 120 and the TEG 140 to be positioned between the first cooling chip 150*a* and the second cooling chip 150*b*.

In other embodiments, at least one cooling chip 150 (e.g., an individual cooling chip 150 not coupled to the micropump layer 110) may comprise a cooling chip fluid inlet 151 and a cooling chip fluid outlet 153 that terminate within the cooling chip 150, between the first outer chip surface 152 and the second outer chip surface 154. In this embodiment, one of the first outer chip surface 152 or the second outer chip surface 154 may operate as a fluid stop and may redirect cooling fluid back towards the micropump layer 110. Further, as depicted in FIGS. 1 and 2, each of the one or more cooling chips 150 may comprise cooling chip fluid inlets 151 and cooling chip fluid outlets 153 that extend through the first outer chip surface 152 and the second outer chip surface 154 and the power electronics assembly 100 may further comprise a cap layer 102 coupled to an individual cooling chip 150 (e.g., the second cooling chip 150*b*) located opposite the micropump layer 110. The cap layer 102 may operate as a fluid stop, redirecting cooling fluid back towards the micropump layer 110 of the cooling chip 150. The cap layer 102 may comprise any non-porous material, for example, glass, ceramic, metal, plastic, polymer, or the like.

Figure 3A:
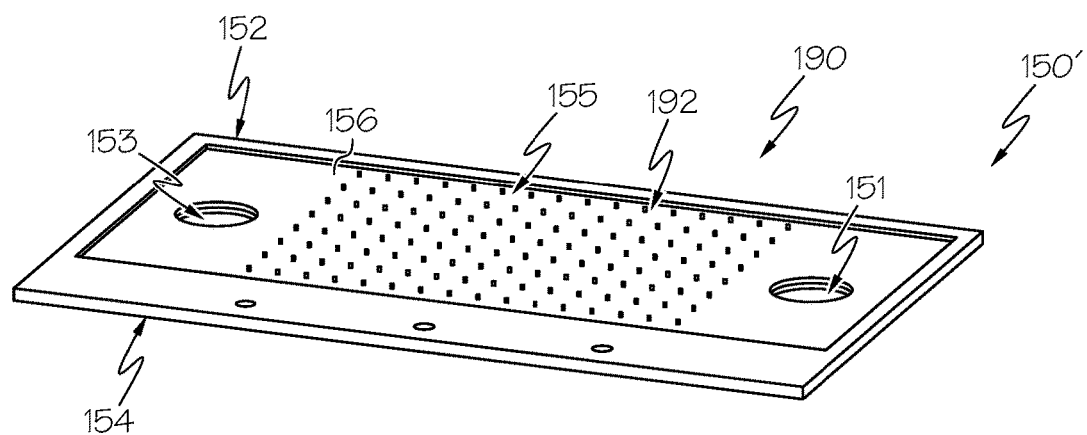
FIG. 3A schematically depicts a first outer chip surface having an example cooling chip, according to one or more embodiments shown and described herein.
Figure 3B:
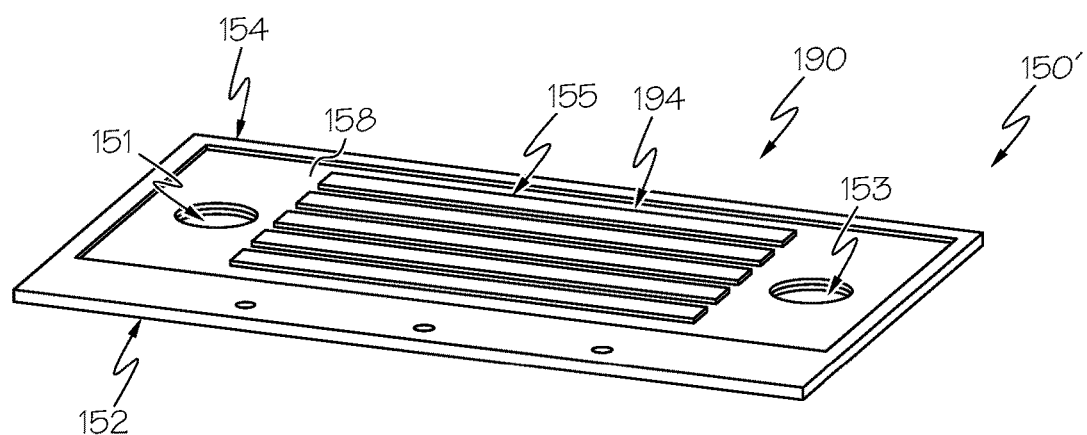
FIG. 3B schematically depicts a second outer chip surface of the example cooling chip of FIG. 3A, according to one or more embodiments shown and described herein.

Referring now to FIGS. 3A and 3B, an example cooling chip 150' is depicted. FIG. 3A depicts the first outer chip surface 152 of the cooling chip 150' and FIG. 3B depicts the second outer chip surface 154 of the cooling chip 150'. As depicted in FIGS. 3A and 3B, the one or more cooling chip fluid channels 155 of the cooling chip 150' extend into the cooling chip 150', for example, into the first outer chip surface 152 (FIG. 3A) and/or the second outer chip surface 154 (FIG. 3B) and terminate at a location between the first outer chip surface 152 and the second outer chip surface 154. In some embodiments, the first outer chip surface 152 and/or the second outer chip surface 154 may comprise an array of fins 190, for example, pin fins 192 (FIG. 3A), channel fins 194 (FIG. 3B), or the like, that collectively define at least a portion the fluid flowpath of the one or more cooling chip fluid channels 155. In operation, the array of fins 190 increase the surface area of the cooling chip fluid channels 155, such that cooling fluid flowing therethrough may contact an increased surface area of the cooling chip 150'.

Referring still to FIGS. 3A and 3B, the example cooling chip 150' may comprises a first recess region 156 extending into the first outer chip surface 152 (FIG. 3A) and/or a second recess region 158 extending into the second outer chip surface 154 (FIG. 3B). In this embodiment, the cooling chip fluid inlet 151 and the cooling chip fluid outlet 153 may extend between the first outer chip surface 152 within the first recess region 156 and the second outer chip surface 154 within the second recess region 158. Further, the array or fins 190, for example, the pin fins 192 (FIG. 3A), the channel fins 194 (FIG. 3B), or the like, may extend outward from the first recess region 156 and/or the second recess region 158. Moreover, in this embodiment, other components of the power electronics assembly 100, such as the first electrode 130, the second electrode 132, the TEG 140, the cap layer 102, a gate drive chip 170 (FIG. 6), a solder layer (not pictured), or the like, may be coupled (e.g., bonded) to the first outer chip surface 152 and/or the second outer chip surface 154, to constrain the one or more cooling chip fluid channels 155 that extend into the first outer chip surface 152 and/or the second outer chip surface 154.

Figure 4A:
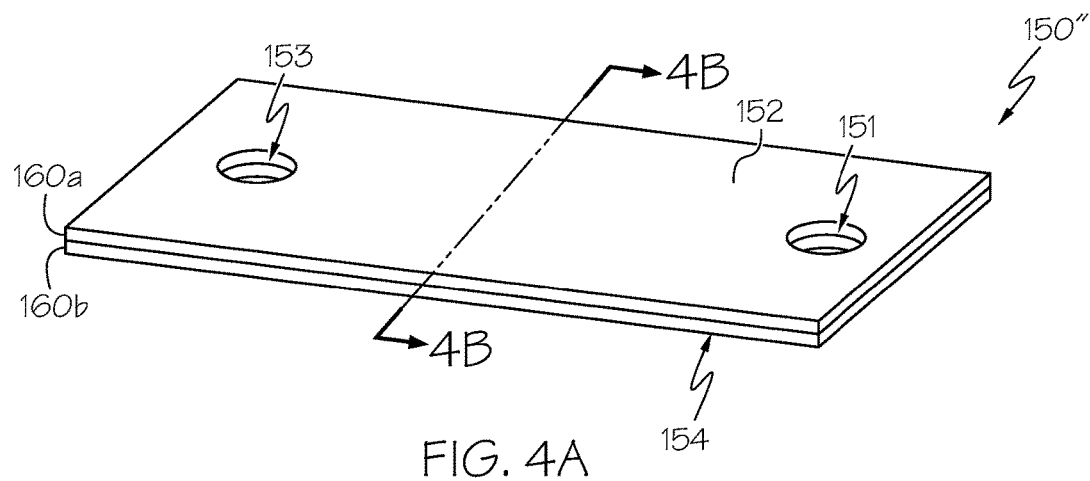
FIG. 4A schematically depicts another example cooling chip, according to one or more embodiments shown and described herein.
Figure 4B:
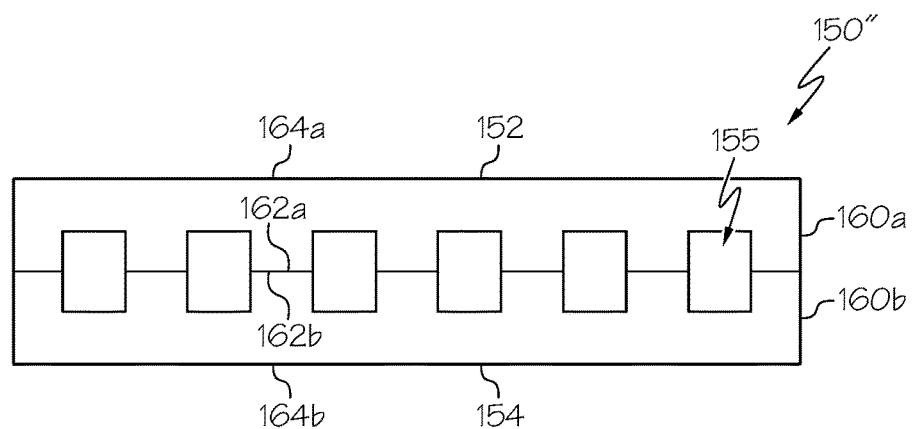
FIG. 4B depicts a cross sectional view of the example cooling chip of FIG. 4B, according to one or more embodiments shown and described herein.

Referring now to FIGS. 4A and 4B, an example cooling chip 150" is depicted. FIG. 4A depicts an isometric view of the example cooling chip 150" and FIG. 4B depicts a cross-sectional view of the example cooling chip 150" depicted in FIG. 4A. The example cooling chip 150" includes a first wafer 160a bonded to a second wafer 160b, for example, by soldering, sintering, brazing, and transient liquid phase bonding (TLP), anodic bonding, or any other known or yet-to be developed bonding method. The first wafer 160a and the second wafer 160b each comprise an inner wafer surface 162a, 162b and an outer wafer surface 164a, 164b, opposite the inner wafer surface 162a, 162b. The inner wafer surface 162a of the first wafer 160a is bonded to the inner wafer surface 162b of the second wafer 160b. The outer wafer surface 164a of the first wafer 160a may be the first outer chip surface 152 and the outer wafer surface 164b of the second wafer 160b may be the second outer chip surface 154. Further, the cooling chip fluid inlet 151 and the cooling chip fluid outlet 153 may extend into one or both of the first wafer 160a and the second wafer 160b. In some embodiments, the cooling chip fluid inlet 151 and the cooling chip fluid outlet 153 of the example cooling chip 150" may extend through both the first wafer 160a and the second wafer 160b and in other embodiments, the cooling chip fluid inlet 151 and the cooling chip fluid outlet 153 of the example cooling chip 150" may extend through one of the first wafer 160a or the second wafer 160b but not through both the first wafer 160a and the second wafer 160b. Moreover, while two wafers 160a, 160b are depicted, it should be understood that the example cooling chip 150" may comprise any number of wafers.

Referring now to FIG. 4B, the one or more cooling chip fluid channels 155 of the example cooling chip 150" may extend into the inner wafer surface 162a of the first wafer 160a, the inner wafer surface 162b of the second wafer 160b, or both. For example, the cooling chip fluid channels 155 of the inner wafer surface 162a of the first wafer 160a, the inner wafer surface 162b of the second wafer 160b, or both, may be formed by etching using a chemical etchant. In this embodiment, at least a portion of the one or more cooling chip fluid channels 155 are encircled by the semiconductor material of the example cooling chip 150", for example, the semiconductor material of both the first wafer 160a and the second wafer 160b. Further, the cooling chip fluid channels 155 formed in the first wafer 160a and/or the second wafer 160b may comprise uniform pin fin arrays, non-uniform pin fin arrays, straight channels, wavy channels, or channels comprising any cross-sectional shape, pathway shape, or pathway topology.

Referring again to FIGS. 1 and 2, the micropump layer 110 may be coupled to the first cooling chip 150a, for example, mechanically coupled to the first cooling chip 150a using one or more fasteners or bonded to the first cooling chip 150a using soldering, sintering, brazing, transient liquid phase bonding (TLP), anodic bonding, or any other known or yet-to be developed bonding method. The micropump layer 110 comprises a micropump inlet 112, a micropump outlet 114 and one or more actuation mechanisms 116 fluidly coupled to the micropump inlet 112 and the micropump outlet 114. Moreover, the cooling chip fluid inlets 151 of each cooling chip 150a, 150b are fluidly coupled to the micropump inlet 112 of the micropump layer 110 and the cooling chip fluid outlets 153 of each cooling chip 150a, 150b are each fluidly coupled to the micropump outlet 114 of the micropump layer 110 such that the one or more actuation mechanisms 116 of the micropump layer 110 may pump cooling fluid through each cooling chip 150a, 150b. Further, the micropump layer 110 may comprise any known or yet to be developed chip scale micropump.

Figure 5:
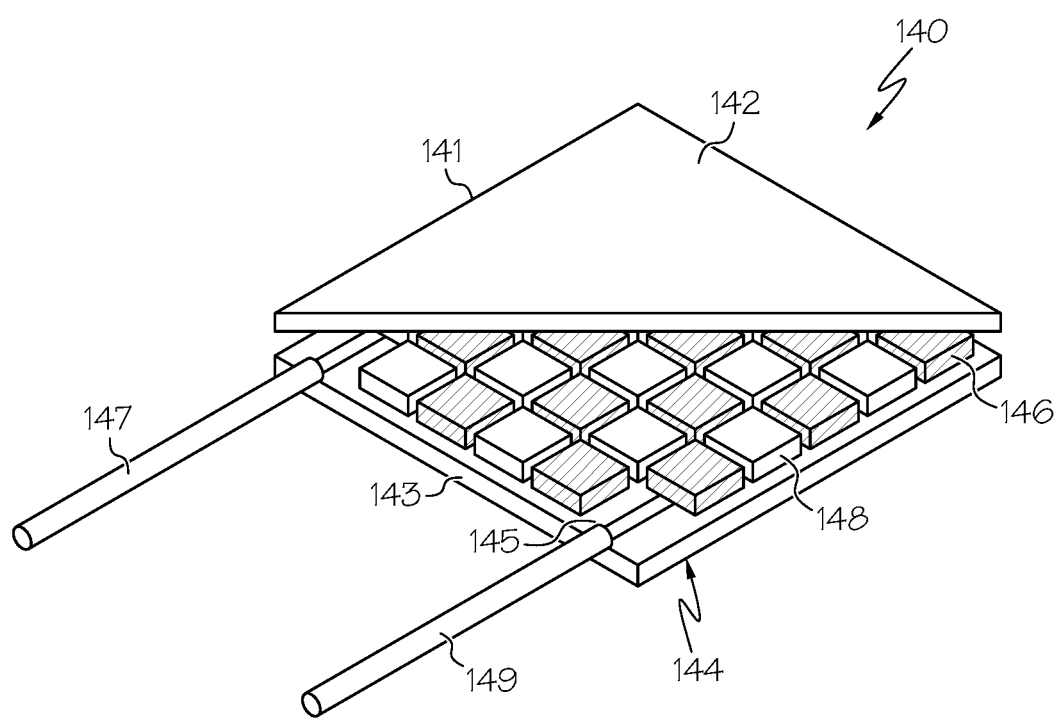
FIG. 5 schematically depicts an example thermo-electric generator, according to one or more embodiments shown and described herein.

Referring now to FIG. 5, the TEG 140 comprises a first TEG substrate 141 having a first substrate surface 142 and a second TEG substrate 143 having a second substrate surface 144, opposite the first substrate surface 142. In some embodiments, the first TEG substrate 141 and the second TEG substrate 143 each comprise a ceramic substrate. Further, the TEG 140 comprises a plurality of p-type semiconductor portions 146 and a plurality of n-type semiconductor portions 148, which may each be positioned between the first TEG substrate 141 and the second TEG substrate 143. In some embodiments, the TEG 140 comprises an equal number of p-type semiconductor portions 146 and n-type semiconductor portions 148. As depicted in FIG. 5, the plurality of p-type semiconductor portions 146 and the plurality of n-type semiconductor portions 148 may be positioned in an interleaved array such that each n-type semiconductor portion 148 is adjacent multiple p-type semiconductor portions 146 and each p-type semiconductor portion 146 is adjacent multiple n-type semiconductor portions 148.

Further, the TEG 140 comprises one or more conduction regions 145, for example, conductor tabs, positioned between and electrically coupled to the plurality of p-type semiconductor portions 146 and the plurality of n-type semiconductor portions 148. In some embodiments, the one or more conduction regions 145 are positioned between the first TEG substrate 141 and the second TEG substrate 143. Moreover, the TEG 140 may include a negative terminal 147 and a positive terminal 149, each electrically coupled to the plurality of p-type semiconductor portions 146 and the plurality of n-type semiconductor portions 148, for example, using the one or more conduction regions 145. The one or more conduction regions 145, the negative terminal 147 and the positive terminal 149 may provide electrical pathways for current to flow from the TEG 140 when the TEG 140 generates voltage, as described below. In some embodiments, the TEG 140 may comprise a thin-film thermoelectric generator. Further, in some embodiments, the TEG 140 may comprise a density of 100 or more n-type semiconductor portions 148 and 100 or more p-type semiconductor portions 146 per each square millimeter (mm) of the TEG 140 (e.g., each square mm of an interior surface of the first TEG substrate 141 or the second TEG substrate 143).

Referring again to FIGS. 1 and 2, the TEG 140 may be positioned between the first cooling chip 150a and the second cooling chip 150b. For example, the TEG 140 may be positioned between and thermally coupled to the semiconductor device 122 and the first cooling chip 150a or may be positioned between and thermally coupled to the semiconductor device 122 and the second cooling chip 150b. In operation, a temperature gradient is formed between the first substrate surface 142 and the second substrate surface 144 of the TEG 140. For example, the TEG 140 may be positioned such that one or the first substrate surface 142 or the second substrate surface 144 faces the semiconductor device 122 and the other of the first substrate surface 142 and the second substrate surface 144 faces one of the first cooling chip 150a or the second cooling chip 150b. In operation, the substrate surface 142, 144 facing the semiconductor device 122 may be a higher temperature than the substrate surface 142, 144 facing an individual cooling chip 150, thereby generating heat flow from the higher temperature substrate surface 142, 144, (e.g., the substrate surface 142, 144 facing the semiconductor device 122) to the lower temperature substrate surface 142, 144 (e.g., the substrate surface 142, 144 facing an individual cooling chip 150a, 150b), which generates a temperature gradient between the first substrate surface 142 and the second substrate surface 144, and causes the TEG 140 to generate voltage.

While not intended to be limited by theory, it is believed that voltage V generated by the TEG 140 may be mathematically described as $V=(n)(\Delta T)(\alpha)$ where n is the number of pairs of p-type and n-type semiconductor portions 146, 148 (where one pair comprises one p-type semiconductor portion 146 and one n-type semiconductor portions 148), $\Delta T$ is the temperature difference between the first substrate surface 142 and the second substrate surface (e.g., the temperature gradient), and $\alpha$ is the Seebeck coefficient of the TEG 140. Thus, in operation, the TEG 140 may generate voltage V, which may be used to provide power to the micropump layer 110. Moreover, in embodiments in which the semiconductor device 122 comprises a wide band gap semiconductor material, the temperature gradient (e.g., $\Delta T$) between the first substrate surface 142 and the second substrate surface 144 may be greater than about 150° C., which allows the TEG 140 to generate more power than embodiments in which the semiconductor device 122 comprises a non-wide bandgap semiconductor material.

Referring still to FIGS. 1 and 2, the power electronics assembly 100 may further comprise one or more through substrate vias (TSVs) 134 extending through at least one of the cooling chips 150a, 150b and at least one of the first electrode 130 and the second electrode 132. The TSVs 134 may comprise an electrically conductive material filled into one or more holes of the various components of the power electronics assembly 100 (e.g., the cooling chips 150a, 150b, the first electrode 130, and the second electrode 132) and/or one or more conductive rods or pillars extending through one or more holes of the various components of the power electronics assembly 100 (e.g., the cooling chips 150a, 150b, the first electrode 130, and the second electrode 132). The electrically conductive material of the TSVs 134 may comprise aluminum, copper, copper oxide, graphite, brass, gold, silver, platinum, or the like. In operation, the one or more TSVs 134 may provide electrical pathways for electrical signals (e.g., current) to be input and output by the semiconductor device stack 120. For example, one or more gate drive circuit portions 172 may be embedded within the semiconductor device 122, the TEG 140, or both. The one or more gate drive circuit portions 172 are electrically coupled to the semiconductor device 122, for example, using the one or more TSVs 134. In operation, the one or more gate drive circuit portions 172 may output control signals to the semiconductor device 122, for example, in embodiments in which the semiconductor device 122 comprises a MOSFET, IGBT, or other semiconductor switching device.

The one or more TSVs 134 may also be electrically coupled to the TEG 140, for example, the negative terminal 137 and the positive terminal 139 of the TEG 140. Moreover, the one or more TSVs 134 may be electrically coupled to the micropump layer 110, for example, electrically coupled to the one or more actuation mechanisms 116 of the micropump layer 110. In operation, the one or more TSVs 134 may also provide electrical pathways for electrical signals (e.g., current) to travel between the TEG 140 and the micropump layer 110, such that the voltage V generated by the TEG 140 may provide power to the micropump layer 110, for example, the one or more actuation mechanisms 116 of the micropump layer 110.

As depicted in FIGS. 1 and 2, in some embodiments, the power electronics assembly 100 may also comprise a secondary power supply 186 electrically coupled to the micropump layer 110. The secondary power supply 186 may provide power to the micropump layer 110 when no power or insufficient power is supplied to the micropump layer 110 by the TEG 140, for example, when the micropump layer 110 is first turned on and a temperature gradient has not yet formed between the first substrate surface 142 and the second substrate surface 144 of the TEG 140. Further, the secondary power supply 186 may be electrically coupled to the TEG 140 and may store energy generated by the TEG 140, for example, when the amount of energy generated by the TEG 140 is greater than the amount of energy needed to power the micropump layer 110.

Figure 6:
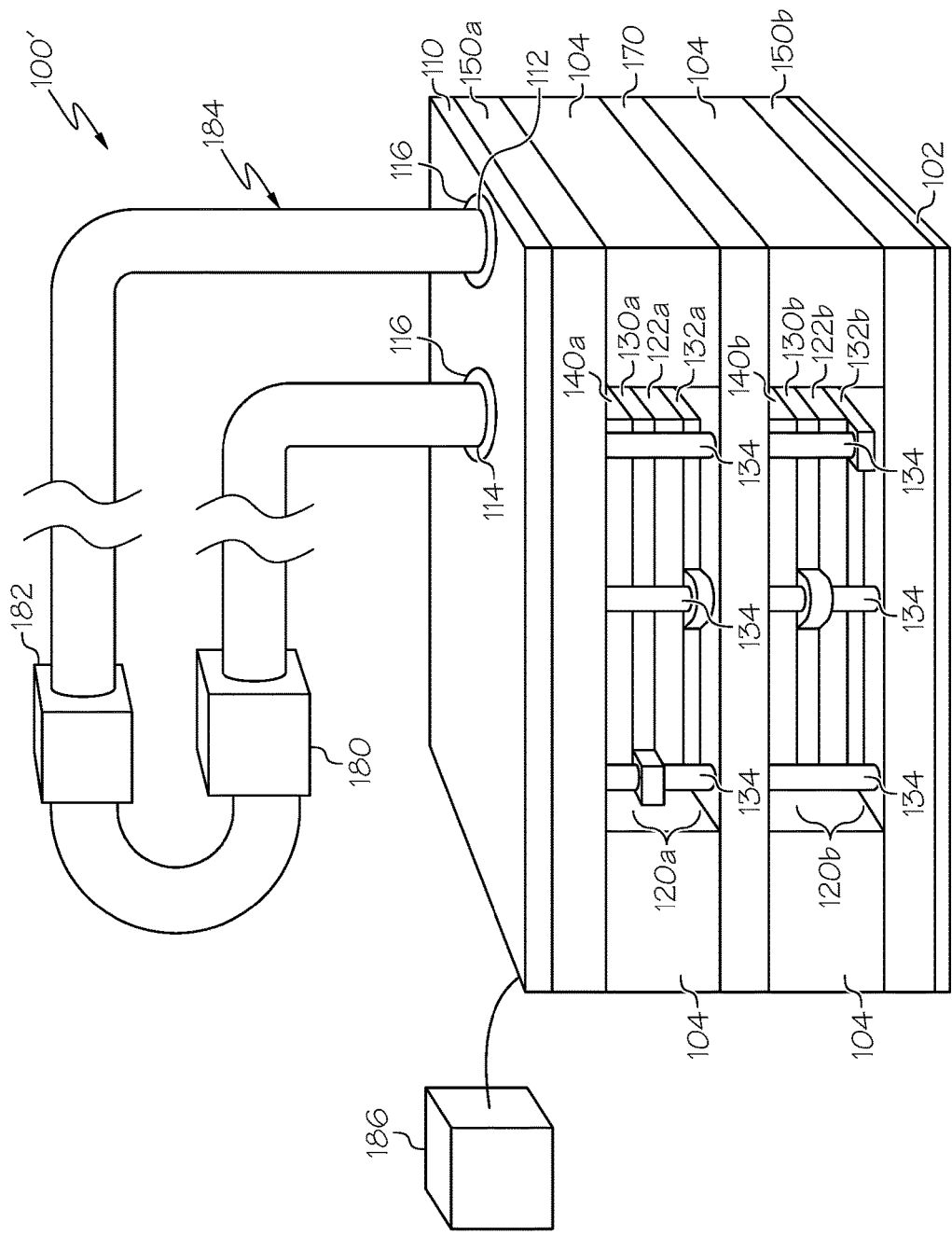
FIG. 6 schematically depicts an isometric view of another example power electronics assembly having a semiconductor device, a thermo-electric generator, a gate drive chip, and two cooling chips, according to one or more embodiments shown and described herein.
Figure 7:
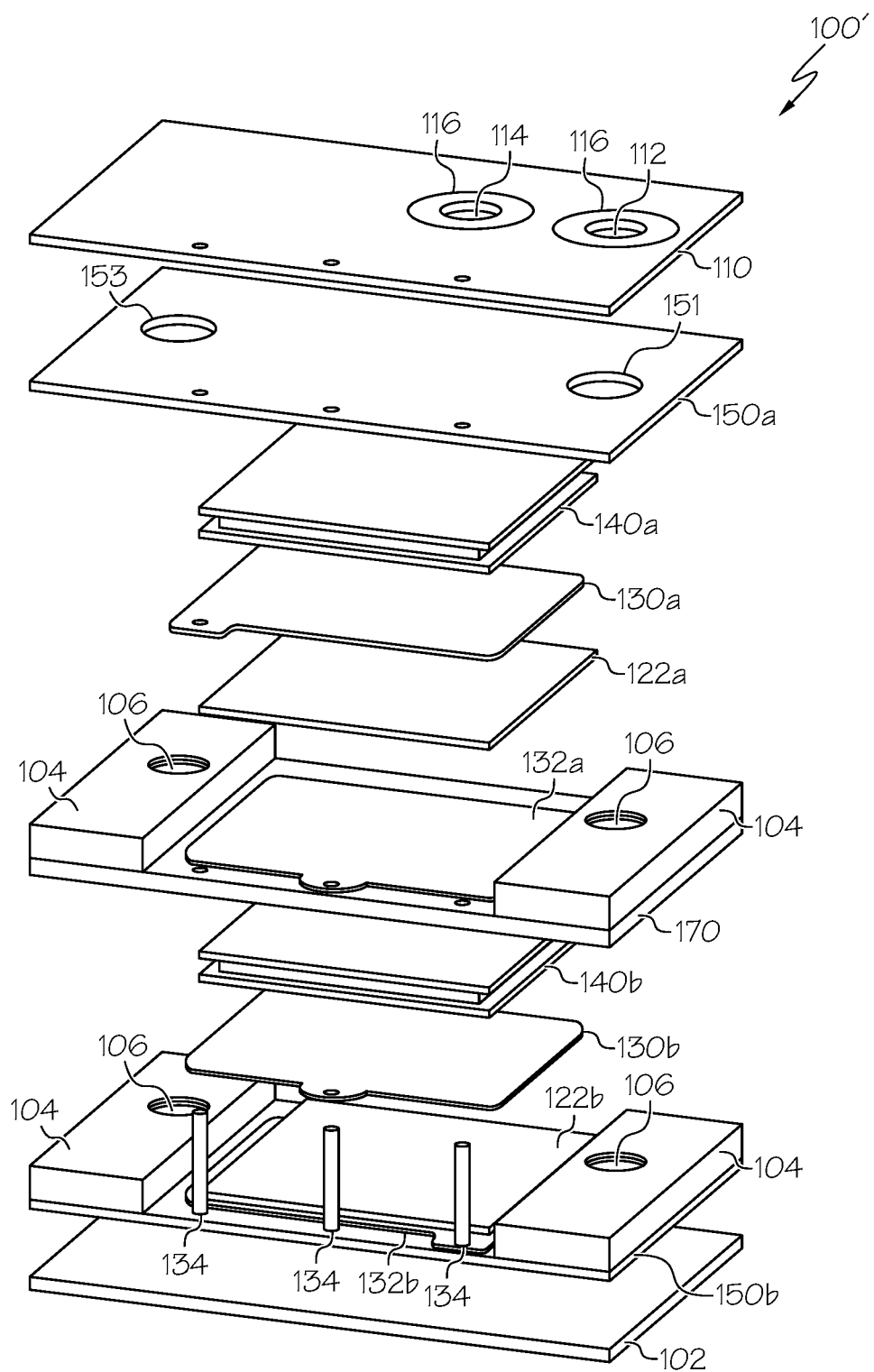
FIG. 7 schematically depicts an exploded view of the power electronics assembly of FIG. 6, according to one or more embodiments shown and described herein.

Referring now to FIGS. 6 and 7, a power electronics assembly 100' comprising the first cooling chip 150a, the second cooling chip 150b, the micropump layer 110, the secondary power supply 186, a first semiconductor device 122a, a second semiconductor device 122b, a first TEG 140a, a second TEG 140b, and a gate drive chip 170 is depicted. FIG. 6 depicts an isometric view of the power electronics assembly 100' and FIG. 7 depicts an exploded view of the power electronics assembly 100'. The first and second semiconductor devices 122a, 122b may comprise any of the embodiments of the semiconductor devices 122 described above and the first and second TEGs 140a, 140b may comprise any of the embodiments of the TEGs 140, described above. Further, first and second electrodes 130a, 132a are coupled (e.g., bonded) to the first semiconductor device 122a to form a first semiconductor device stack 120a and may comprise any of the embodiments of the first and second electrodes 130, 132 described above and first and second electrodes 130b, 132b are coupled (e.g., bonded) to the second semiconductor device 122b to form a second semiconductor device stack 120b and may comprise any of the embodiments of the first and electrodes 130, 132, described above. Further, both the first TEG 140a and the second TEG 140b may be electrically coupled to the micropump layer 110, for example, using TSVs 134, to provide power to the micropump layer 110, as described above.

As depicted in FIGS. 6 and 7, the gate drive chip 170 is positioned between the first and second cooling chips 150a, 150b. The first TEG 140a and the first semiconductor device stack 120a may be positioned between the first cooling chip 150a and the gate drive chip 170. The second TEG 140b and the second semiconductor device stack 120b may be positioned between the second cooling chip 150b and the gate drive chip 170. Further, one or more chip connector portions 104 may be positioned between and coupled (e.g., bonded or fastened) to the first cooling chip 150a and the gate drive chip 170 and one or more chip connector portions 104 are also positioned between and coupled (e.g., bonded or fastened) to the gate drive chip 170 and the second cooling chip 150b. Further, chip connector fluid throughputs 106 extend through each chip connector portion 104 and may be fluidly aligned with the cooling chip fluid inlets 151 and/or cooling chip fluid outlets 153 of the first cooling chip 150*a* and the second cooling chip 150*b*.

The gate drive chip 170 may further include fluid throughputs (not pictured) that are aligned with the chip connector fluid throughputs 106 and provide a fluid pathway for cooling fluid to flow between the first cooling chip 150*a* and the second cooling chip 150*b*. The gate drive chip 170 is electrically coupled to the first semiconductor device 122*a* and the second semiconductor device 122*b*, for example, using the TSVs 134. Further, the gate drive chip 170 may comprise one or more gate drive circuits that output control signals to the first semiconductor device 122*a* and the second semiconductor device 122*b*, for example, in embodiments in which the semiconductor devices 122*a* and 122*b*, comprises a MOSFET, IGBT, or other semiconductor switching devices.

Referring now to FIGS. 1 and 6, the power electronics assemblies 100, 100' may further comprise a cooling fluid reservoir 180 and a secondary heat exchanger 182, each fluidly coupled to the micropump inlet 112 and the micropump outlet 114. For example, a coolant pipe system 184 may extend between and fluidly couple the micropump inlet 112 and the micropump outlet 114 with the cooling fluid reservoir 180 and the secondary heat exchanger 182, and also fluidly couple the cooling fluid reservoir 180 to the secondary heat exchanger 182. In operation, the cooling fluid reservoir 180 may house cooling fluid, and the micropump layer 110 (e.g., the one or more actuation mechanisms 116 of the micropump layer 110) may pump the cooling fluid from the cooling fluid reservoir 180 to the micropump inlet 112, through the one or more cooling chips 150*a*, 150*b*, and from the micropump outlet 114 to the secondary heat exchanger 182 and the cooling fluid reservoir 180. Further, the secondary heat exchanger 182 may remove heat collected by the cooling fluid before the cooling fluid enters the cooling fluid reservoir 180.

Referring again to FIGS. 1-7, a method of cooling the semiconductor device 122 of the power electronics assembly 100 is contemplated. The method includes generating heat using the semiconductor device 122, for example, by operating the semiconductor device 122, and pumping cooling fluid through the first cooling chip 150*a* and the second cooling chip 150*b* to remove heat from the semiconductor device 122. The cooling fluid may be pumped through the first and second cooling layers 150*a*, 150*b* using the micropump layer 110, for example, using the one or more actuation mechanisms 116 of the micropump layer 110. For example, the cooling fluid may be pumped from the cooling fluid reservoir 180 into the micropump inlet 112 of the micropump layer 110. The cooling fluid may flow from the micropump inlet 112 through the one or more cooling chip fluid channels 155 of the first cooling chip 150*a* and the second cooling chip 150*b*, which provide a fluid pathway such that cooling fluid flowing therethrough may remove heat from the semiconductor device stack 120 for example, heat generated by the semiconductor device 122. Next, the cooling fluid may flow from the one or more cooling chip fluid channels 155 positioned in the first cooling chip 150*a* and the second cooling chip 150*b* and exit the micropump outlet 114. After exiting the micropump outlet 114, the now heated cooling fluid may flow through the coolant pipe system 184 to the secondary heat exchanger 182, which cools the now heated cooling fluid. Next, the cooling fluid flows through the coolant pipe system 184 and into the cooling fluid reservoir 180, where the cooling fluid is ready for reuse.

Further, when cooling fluid is circulated through the cooling chip fluid channels 155 of the one or more cooling chips 150, thereby removing heat from the semiconductor device 122, heat flow is generated between the first substrate surface 142 and the second substrate surface 144 of the TEG 140. This forms a temperature gradient between the first substrate surface 142 and the second substrate surface 144 of the TEG 140 and causes the TEG 140 to generate voltage, as described above. This generated voltage produces a signal (e.g., a current) which may provide a power signal to the micropump layer 110 to provide power to the micropump layer 110, for example, the one or more actuation mechanisms 116 of the micropump layer.

The voltage generated by the TEG 140 and the signal output by the TEG 140 corresponds with the temperature gradient. For example, when the temperature gradient increases, more voltage is generated by the TEG 140 and a stronger signal (e.g., a stronger power signal) is output by the TEG 140, providing increased power to the micropump layer 110 such that the micropump layer 110 may increase cooling fluid flow through the one or more cooling chips 150. Further, when the temperature gradient decreases, less voltage is generated by the TEG 140 and a weaker signal (e.g., a weaker power signal) is output by the TEG 140, providing decreased power to the micropump layer 110 such that the micropump layer 110 may decrease cooling fluid flow through the one or more cooling chips 150.

The correlation between the temperature gradient and the signal power output by the TEG 140 allows the TEG 140 to provide a temperature feedback loop that replaces the functionally of a temperature sensor. Further, the method may comprise adjusting a pumping power of the micropump layer 110 based on the signal output by the TEG 140, for example, increasing the pumping power of the micropump layer 110 when the temperature gradient between the first substrate surface 142 and the second substrate surface 144 of the TEG 140 increases and decreasing the pumping power of the micropump layer 110 when the temperature gradient between the first substrate surface 142 and the second substrate surface 144 of the TEG 140 decreases. For example, pumping power may by continuously adjusted with respect to the signal output by the TEG 140 (e.g., linearly, exponentially, logarithmically, or the like) or may be adjusted with respect to a threshold temperature gradient. For example, the pumping power output by the micropump layer 110 may be increased when the temperature gradient of the TEG 140 is greater than the threshold temperature gradient and the pumping power may be decreased when the temperature gradient of the TEG 140 is less than the threshold temperature gradient.

It should now be understood that the embodiments described herein may be directed to power electronics assemblies that include a micropump layer, cooling chips for cooling heat generating semiconductor devices, and thermo-electric generators that may generate energy from a temperature gradient formed while the cooling chips fluidly cool the heat generating semiconductor device. Further, the thermo-electric generator may be electrically coupled to the micropump layer and may provide energy to the micropump layer to power the micropump layer. The micropump layer, cooling chips, semiconductor devices, and thermo-electric generators may be arranged in a chip stack to reduce the size of the power electronics assembly. Further, the thermo-electric generators increase the efficiency of the power electronics system by harvesting energy and providing this harvested energy to the micropump layer. Accordingly, the embodiments described herein provide compact power electronics assemblies that efficiently cool high temperature heat generating semiconductor devices using embedded cooling arrangements and thermo-electric generators.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
   a first cooling chip fluidly coupled to a second cooling chip, wherein the first cooling chip and the second cooling chip each comprise:
      a cooling chip fluid inlet;
      a cooling chip fluid outlet; and
      one or more cooling chip fluid channels extending between and fluidly coupled to the cooling chip fluid inlet and the cooling chip fluid outlet;
   a semiconductor device positioned between and thermally coupled to the first cooling chip and the second cooling chip; and
   a thermo-electric; generator positioned between and thermally coupled to the first cooling chip and the second cooling chip, wherein the first cooling chip is positioned between the thermo-electric generator and a micropump layer in a stacked arrangement.

2. The power electronics assembly of claim 1, wherein the semiconductor device is positioned within a semiconductor device stack, the semiconductor device stack is positioned between and thermally coupled to the first cooling chip and the second cooling chip, and the semiconductor device stack further comprises:
   a first electrode electrically and thermally coupled to a first device surface of the semiconductor device; and
   a second electrode electrically and thermally coupled to a second device surface of the semiconductor device, wherein the first device surface is opposite the second device surface.

3. The power electronics assembly of claim 2, wherein the first electrode comprises a drain electrode and the second electrode comprises a source electrode each thermally and electrically coupled to the semiconductor device such that a vertical current pathway extends through the semiconductor device from the source electrode to the drain electrode.

4. The power electronics assembly of claim 1, wherein the thermo-electric generator comprises a thin-film thermo-electric generator.

5. The power electronics assembly of claim 1, wherein the one or more cooling chip fluid channels comprise a plurality of channel fins, a plurality of pin fins, or both a plurality of channel fins and a plurality of pin fins, extending from the first cooling chip and the second cooling chip.

6. The power electronics assembly of claim 1, wherein the first cooling chip further comprises:
   a first wafer comprising an inner wafer surface opposite an outer wafer surface; and
   a second wafer comprising an inner wafer surface opposite an outer wafer surface, wherein:
      the inner wafer surface of the first wafer is bonded to the inner wafer surface of the second wafer;
      the cooling chip fluid inlet and the cooling chip fluid outlet each extend into the first wafer and the second wafer; and
      at least a portion of the one or more cooling chip fluid channels extend into one or both of the inner wafer surface of the first wafer and the inner wafer surface of the second wafer.

7. The power electronics assembly of claim 1, wherein the micropump layer comprises a micropump fluid inlet, a micropump fluid outlet, and one or more actuation mechanisms fluidly coupled to the micropump fluid inlet and the micropump fluid outlet, wherein the micropump layer is fluidly coupled to the first cooling chip and the second cooling chip.

8. The power electronics assembly of claim 7, wherein the thermo-electric generator is electrically coupled to the one or more actuation mechanisms of the micropump layer such that energy generated by the thermo-electric generator provides power to the one or more actuation mechanisms.

9. The power electronics assembly of claim 1, wherein the semiconductor device comprises a semiconductor material comprising at least one of Si, SiC, GaN, AlN, BN and diamond.

10. The power electronics assembly of claim 1, wherein the first cooling chip and the second cooling chip each comprise a semiconductor material.

11. The power electronics assembly of claim 1, further comprising a gate drive chip positioned between the first cooling chip and the second cooling chip, wherein the gate drive chip comprises a gate drive circuit electrically coupled to the semiconductor device.

12. The power electronics assembly of claim 1, further comprising one or more gate drive circuit portions embedded within the semiconductor device, the thermo-electric generator, or both, wherein the one or more gate drive circuit portions are electrically coupled to the semiconductor device.

13. A power electronics assembly comprising:
   a first cooling chip fluidly coupled to a second cooling chip, wherein the first cooling chip and the second cooling chip each comprise:
      a cooling chip fluid inlet;
      a cooling chip fluid outlet; and
      one or more cooling chip fluid channels extending between and fluidly coupled to the cooling chip fluid inlet and the cooling chip fluid outlet;
   a micropump layer fluidly coupled to the first cooling chip;
   a semiconductor device positioned between and thermally coupled to the first cooling chip and the second cooling chip; and
   a thermo-electric generator positioned between and thermally coupled to the first cooling chip and the second cooling chip, wherein the thermo-electric generator is electrically coupled to the micropump layer such that energy generated by the thermo-electric generator provides power to the micropump layer, and further wherein the first cooling chip is positioned between the thermo-electric generator and the micropump layer in a stacked arrangement.

14. The power electronics assembly of claim 13, further comprising a cap layer coupled to the second cooling chip such that the first cooling chip, the second cooling chip, the semiconductor device, and the thermo-electric generator are each positioned between the cap layer and the micropump layer.

15. The power electronics assembly of claim 13, further comprising one or more through substrate vias extending between and electrically coupling the thermo-electric generator and the micropump layer.

16. The power electronics assembly of claim 13, further comprising:
   a secondary heat exchanger fluidly coupled to the micropump layer; and
   a cooling fluid reservoir fluidly coupled to and positioned between the secondary heat exchanger and the micropump layer.

17. The power electronics assembly of claim 13, wherein the semiconductor device comprises a semiconductor material comprising at least one of Si, SiC, GaN, AlN, BN and diamond.

18. A method of cooling a semiconductor device of a power electronics assembly, the method comprising:
   generating heat using a semiconductor device positioned between and thermally coupled to a first cooling chip and a second cooling chip, wherein the first cooling chip and the second cooling chip each comprise:
      a cooling chip fluid inlet;
      a cooling chip fluid outlet; and
      one or more cooling chip fluid channels extending between and fluidly coupled to the cooling chip fluid inlet and the cooling chip fluid outlet;
   pumping cooling fluid through the first cooling chip and the second cooling chip using a micropump layer fluidly coupled to the first cooling chip thereby removing heat from the semiconductor device and forming a temperature gradient between a first substrate surface and a second substrate surface of a thermo-electric generator positioned between and thermally coupled to the first cooling chip and the second cooling chip, wherein the micropump layer is electrically coupled to the thermo-electric generator, and wherein the first cooling chip is positioned between the thermo-electric generator and the micropump layer in a stacked arrangement; and
   adjusting a pumping power of the micropump layer based on a signal output by the thermo-electric generator, wherein the signal corresponds with the temperature gradient between the first substrate surface and the second substrate surface of the thermo-electric generator.

19. The method of claim 18, wherein adjusting the pumping power of the micropump layer comprises increasing the pumping power of the micropump layer when the temperature gradient between the first substrate surface and the second substrate surface of the thermo-electric generator is greater than a threshold temperature gradient.

20. The method of claim 18, wherein the signal is a power signal generated by the thermo-electric generator, wherein the power signal provides power to the micropump layer.

* * * * *

UNITED STATES PATENT AND TRADEMARK OFFICE
CERTIFICATE OF CORRECTION

PATENT NO. : 10,231,364 B2
APPLICATION NO. : 15/332537
DATED : March 12, 2019
INVENTOR(S) : Ercan Mehmet Dede, Shailesh N. Joshi and Chi-Ming Wang It is certified that error appears in the above-identified patent and that said Letters Patent is hereby corrected as shown below:

In the Claims

In Column 13, Line 35, after ☐a thermo-electric☐, delete ";".

Signed and Sealed this
Seventh Day of May, 2019

Andrei Iancu
*Director of the United States Patent and Trademark Office*